United States Patent
Hong et al.

(10) Patent No.: US 6,727,770 B2
(45) Date of Patent: Apr. 27, 2004

(54) MULTI-BAND VOLTAGE CONTROLLED OSCILLATOR CIRCUIT

(75) Inventors: Seong-Beom Hong, Cheju (KR); Jong-Goo Kim, Yongin (KR)

(73) Assignee: Samsung Electronics Co., Ltd. (KR)

( * ) Notice: Subject to any disclaimer, the term of this patent is extended or adjusted under 35 U.S.C. 154(b) by 4 days.

(21) Appl. No.: 10/134,558

(22) Filed: Apr. 29, 2002

(65) Prior Publication Data

US 2002/0190806 A1 Dec. 19, 2002

(30) Foreign Application Priority Data

Apr. 30, 2001 (KR) ........................................ 2001-23292

(51) Int. Cl.[7] ................................................ H03B 7/00
(52) U.S. Cl. .................................. 331/179; 331/177 V
(58) Field of Search .............................. 331/179, 177 V, 331/117 R, 167, 36 C

(56) References Cited

U.S. PATENT DOCUMENTS

| | | | | |
|---|---|---|---|---|
| 5,625,325 A | * | 4/1997 | Rotzoll et al. | ................. 331/16 |
| 5,648,744 A | * | 7/1997 | Prakash et al. | ................. 331/11 |
| 5,739,730 A | * | 4/1998 | Rotzoll | .................... 331/177 V |
| 5,832,023 A | * | 11/1998 | Latva-aho | .................... 375/148 |
| 6,081,168 A | * | 6/2000 | Park | ............................ 331/179 |
| 6,445,257 B1 | * | 9/2002 | Cox et al. | .............. 3331/117 R |

* cited by examiner

*Primary Examiner*—Robert Pascal
*Assistant Examiner*—Joseph Chang
(74) *Attorney, Agent, or Firm*—Dilworth & Barrese, LLP

(57) ABSTRACT

Disclosed is a multi-band voltage controlled oscillator circuit comprising a resonant circuit including at least one varactor, at least one capacitor and at least one inductor operated in response to a control voltage, the resonant circuit having a resonance frequency determined according to capacitances of the varactor and capacitor and an inductance of the inductor. The multi-band voltage controlled oscillator circuit further comprises at least one band selection circuit for adjusting the resonance frequency in response to a band selection signal, the band selection circuit including at least one capacitor connected in parallel to the resonant circuit, and a switching element for turning on/off the capacitor in response to the band selection signal.

18 Claims, 3 Drawing Sheets

MULTI-BAND VOLTAGE CONTROLLED OSCILLATOR CIRCUIT

PRIORITY

This application claims priority to an application entitled "Multi-Band Voltage Controlled Oscillator Circuit", filed in the Korean Industrial Property Office on Apr. 30, 2001 and assigned Serial No. 2001-23292, the contents of which are hereby incorporated by reference.

BACKGROUND OF THE INVENTION

1. Field of the Invention

The present invention relates to a voltage controlled oscillator (VCO), and more particularly to a multi-band voltage controlled oscillator circuit that generates a multi-band oscillator frequency signal and has a band-switchable resonant circuit.

2. Description of the Related Art

As is well known in the art, a radio communication system employing a super heterodyne system uses a local oscillator frequency signal to up-convert a modulated baseband signal into a radio frequency (RF) signal or to down-convert a received RF signal into a baseband signal. In this regard, the radio communication system has at least one oscillator capable of generating a local oscillator frequency signal of a desired band.

FIG. 1 is a circuit diagram illustrating a basic construction of a Colpitts oscillator, which is typically used in a radio communication system.

Referring to FIG. 1, the Colpitts oscillator comprises a resonator 110, a feedback circuit 120 and an amplifier 100. The resonator 110 includes varactors CV1 and CV2 connected to ground, and an inductor L connected in parallel to the varactors CV1 and CV2. The varactors CV1 and CV2 conduct based on a control voltage to determine a resonance frequency in association with the inductor L. The feedback circuit 120 feeds an output signal (having the resonance frequency) from the resonator 110 back to the amplifier 100. The amplifier 100 amplifies the signal fed back from the feedback circuit 120 and transfers the amplified signal again to the resonator 110. As a result, the Collpitts oscillator generates a resonance frequency signal of sufficiently high amplitude and a desired band.

The resonance frequency f can be defined as in the following equation 1:

$$f = \frac{1}{2\pi\sqrt{L*(CV1 \,/\!/\, CV2)}} \quad \text{[Equation 1]}$$

In the oscillator illustrated in FIG. 1, operating in the above manner, the varactors CV1 and CV2 vary in capacitance with the control voltage, resulting in a variation in the resonance frequency. For this reason, the oscillator of FIG. 1 is typically referred to as a voltage controlled oscillator (referred to hereinafter as VCO). This VCO is widely used in radio communication systems requiring a frequency channel switching operation, in that it has the advantage of varying a resonance frequency with a control voltage.

With the development of radio communication techniques, a radio communication system supporting CDMA (Code Division Multiple Access) has a frequency band expanded from 800 MHz (IS-95 and IS-54) to 1900 MHz (ANSI J-STD-008 and DCS1800). Moreover, the introduction of the IMT-2000 technology development brings with it the active use of a frequency band of 2.0 GHz or more by a radio communication system. For communication with both of the systems using such different frequency bands, a specific radio communication system must support both of the frequency bands. In this regard, a radio communication system supporting radio frequencies of different bands requires a multi-band voltage control oscillator circuit capable of generating multi-band local oscillator frequencies associated with the radio frequencies.

SUMMARY OF THE INVENTION

Therefore, the present invention has been made in view of the above problems, and it is an object of the present invention to provide a VCO circuit for generating multi-band local oscillator frequencies.

It is another object of the present invention to provide a VCO circuit, which comprises a band selection circuit for adjusting a resonance frequency for selective adjustment of an output frequency in a radio communication system supporting radio frequencies of different bands.

In accordance with one embodiment of the present invention, the above and other objects are accomplished by utilizing a multi-band voltage controlled oscillator circuit comprising a resonant circuit operated in response to a control voltage, the resonant circuit having a resonance frequency determined depending on the control voltage; and at least one band selection circuit connected in parallel to the resonant circuit for adjusting the resonance frequency in response to a unique band selection signal.

In accordance with another embodiment of the present invention, there is provided a multi-band voltage controlled oscillator circuit comprising a resonant circuit and at least one band selection circuit. The resonant circuit includes at least one varactor, at least one capacitor and at least one inductor operated in response to a control voltage. Also, the resonant circuit has a resonance frequency determined according to capacitances of the varactor and capacitor and an inductance of the inductor. The one band selection circuit adjusts the resonance frequency in response to a band selection signal. The band selection circuit includes at least one capacitor connected in parallel to the resonant circuit, and a switching element for turning on/off the capacitor in response to the band selection signal.

BRIEF DESCRIPTION OF THE DRAWINGS

The above and other objects, features and other advantages of the present invention will be more clearly understood from the following detailed description when taken in conjunction with the accompanying drawings, in which.

DETAILED DESCRIPTION OF THE PREFERRED EMBODIMENTS

Preferred embodiments of the present invention will be described in detail herein below with reference to the annexed drawings. In the following description, a detailed description of known functions and configurations incorporated herein will be omitted when it may obscure the subject matter of the present invention in unnecessary details. Terms in the following description are defined in consideration of functions according to the present invention, so that they can be varied with purpose of a user and a manager, or precedent and the like. Therefore, definitions of the terms should be made on the basis of the overall contents.

Figure 1:
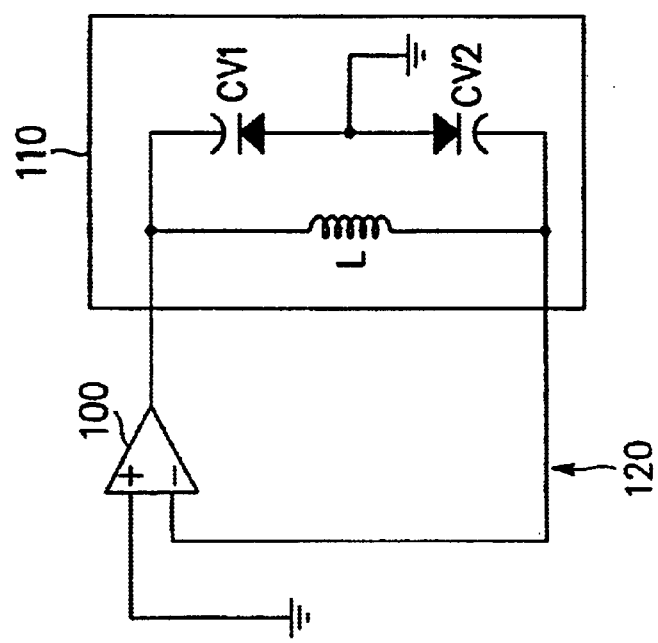
FIG. 1 is a circuit diagram illustrating the construction of a typical Colpitts oscillator.
Figure 2:
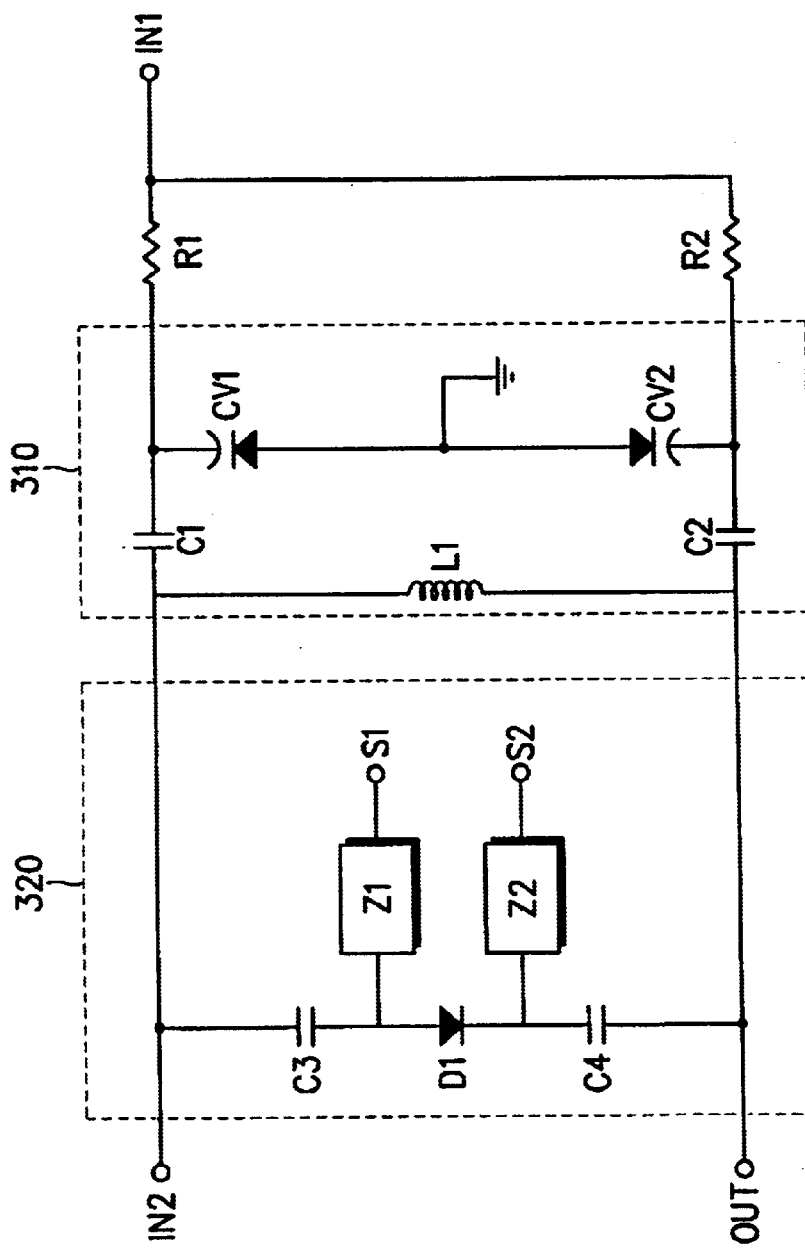
FIG. 2 is a circuit diagram illustrating the construction of a dual-band voltage controlled oscillator circuit in accordance with a preferred embodiment of the present invention.

FIG. 2 illustrates a dual-band VCO circuit according to a preferred embodiment of the present invention. In the following description of the construction and operation of the dual-band VCO circuit with reference to FIG. 2, an amplifier and a feedback circuit are not shown in the drawing and a detailed description thereof will be omitted, because they are not main constituents of the dual-band VCO.

Referring to FIG. 2, the dual-band VCO circuit comprises a resonant circuit 310 for inputting a control voltage, and a band selection circuit 320 for generating an output signal of a frequency of a first or second band in response to a band selection signal.

The resonant circuit 310 includes varactors CV1 and CV2 connected to ground, capacitors C1 and C2 connected in series to the varactors CV1 and CV2, respectively, and an inductor L1 connected in parallel to the capacitors C1 and C2. A phase locked loop (PLL, not shown) supplies the control voltage to a terminal IN1. The control voltage has a predetermined level (for example, 1.5V). The control voltage is fed to the resonant circuit 310 through resistors R1 and R2, which isolate the resonant circuit 310 from the PLL.

The band selection circuit 320 includes capacitors C3 and C4 connected in series to each other and in parallel to the inductor L1, and a switching element D1 connected between the capacitors C3 and C4 for turning on/off the capacitors C3 and C4 in response to the band selection signal, which is applied through an external terminal S1 or S2. The switching element D1 is preferably a switching diode or pin diode. The switching element D1 is isolated from the band selection signal applied thereto by isolation elements Z1 and Z2. The isolation elements Z1 and Z2 are preferably RF choke coils or resistors.

The resonant circuit 310 and band selection circuit 320 provide their output signal to the feedback circuit through a terminal OUT. The feedback circuit transfers the provided signal to the amplifier. The amplifier provides its output signal to the resonant circuit 310 and band selection circuit 320 through a terminal IN2.

As illustrated in FIG. 2, the band selection circuit 320 is configured to select a desired dual-band frequency to be designed (for example, a PCS band frequency or CDMA band frequency), and a pin diode (D1 in FIG. 2) is provided in the band selection circuit 320 to perform a turning-on/off operation. The pin diode D1 is connected between two coupling capacitors (C3 and C4 in FIG. 2), which are in turn connected in parallel to the resonant circuit 310. As the pin diode D1 is turned on/off, the entire circuit varies in capacitance, resulting in the final output signal being adjusted in oscillator frequency.

In the band selection circuit 320, the pin diode D1 has an anode connected in common to the capacitor C3 and through the isolation element Z1 to the terminal S1, and a cathode connected in common to the capacitor C4 and through the isolation element Z2 to the terminal S2. The band selection signal applied to the terminal S1 or S2 provides a forward or reverse bias to the pin diode D1. As an example, when the terminal S1 is applied with Vcc and the terminal S2 is applied with digital HIGH, the pin diode D1 is operated in a reverse biased state. As another example, when the terminal S1 is applied with Vcc and the terminal S2 is applied with digital LOW, the pin diode D1 is operated in a forward biased state.

In the above manner, the band selection signal provides the forward or reverse bias to the pin diode D1. The pin diode D1 turns on/off the capacitors C3 and C4 according to a biased state.

The operation of the pin diode D1 in accordance with the present invention will hereinafter be described in detail.

The pin diode D1 acts as a resistor or capacitor according to a biased state to turn on/off the capacitors C3 and C4. As a result, the resonant circuit varies in capacitance, thereby causing the VCO to vary in operating band. When the pin diode D1 is forward biased in response to the band selection signal, it acts as a resistor with a resistance Ron of about 0~1Ω, thereby causing the capacitors C3 and C4 to be turned on. If the entire capacitance of the VCO is assumed to be Cf, then it can be defined as in the below equation 2:

$$Cf = (C1//C2//CV1//CV2) + (C3//C4) \qquad \text{[Equation 2]}$$

In this case, a resonance frequency $f_{for}$ can be expressed by the following equation 3:

$$f_{for} = \frac{1}{2\pi\sqrt{L*Cf}} \qquad \text{[Equation 3]}$$

On the other hand, when the pin diode D1 is reverse-biased, it acts as a capacitor with a capacitance value Coff of about 0~1 pF, thereby causing the capacitors C3 and C4 to be turned off. If the entire capacitance of the VCO is Cr, then it can be defined as in equation 4 below:

$$Cr = (C1//C2//CV1//CV2) + (C3//Coff//C4) \qquad \text{[Equation 4]}$$

Since Coff is much smaller than the C3 and C4, the term (C3//Coff//C4) has a value small enough to be negligible. In this case, a resonance frequency $f_{rev}$ can be expressed by the following equation 5:

$$f_{rev} = \frac{1}{2\pi\sqrt{L*Cr}} \qquad \text{[Equation 5]}$$

, where L is an inductance of the inductor L1.

As a result, the resonance frequency of the output signal becomes $f_{for}$ or $f_{rev}$ according to a bias condition of the pin diode D1. The inclusion of the capacitors C3 and C4 with appropriate capacitances and the pin diode D1 in the design of the VCO allows it to have a resonance frequency necessary for a dual-band radio communication system. The resonance frequency is selected on the basis of the band selection signal in this manner.

According to the present invention, the VCO circuit may further comprise at least one inductor or capacitor to obtain an optimum gain, increase a quality factor Q of the resonant circuit, or perform DC blocking. The quality factor Q, which is a measure for evaluation of quality of an oscillator using series resonance, is expressed by $$Q = \frac{Xtotal}{Rtotal},$$

and it is known in the art that the greater the Q value, the more superior the quality of the oscillator. It is common that an inductor and a capacitor, which constitute an oscillator, each have a reactance X and an internal resistance Rs. Assuming that, in the VCO circuit of FIG. 2, a series connection of C1, C2, CV1 and CV2 has a reactance X1 and an internal resistance Rs1, and a series connection of C3, D1 and C4 therein has a reactance X2 and an internal resistance Rs2, a quality factor based on the total capacitance is $$QC = \frac{X1 \mathbin{/\mkern-5mu/} X2}{Rs1 \mathbin{/\mkern-5mu/} Rs2}.$$

Further, assuming that the inductor L1 has a reactance X3 and an internal resistance Rs3, a quality factor based on the total inductance is $$QL = \frac{X3}{Rs3}.$$

Consequently, the total quality factor can be expressed by $$Q = \frac{(X1 \mathbin{/\mkern-5mu/} X2) + X3}{(Rs1 \mathbin{/\mkern-5mu/} Rs2) + Rs3}.$$

While the numerator of this equation is determined depending on a desired resonance frequency, the denominator thereof has a very small value because it consists of only internal resistances connected in parallel. As a result, it is understood that the VCO circuit according to the present invention has a very high quality factor.

Figure 3:
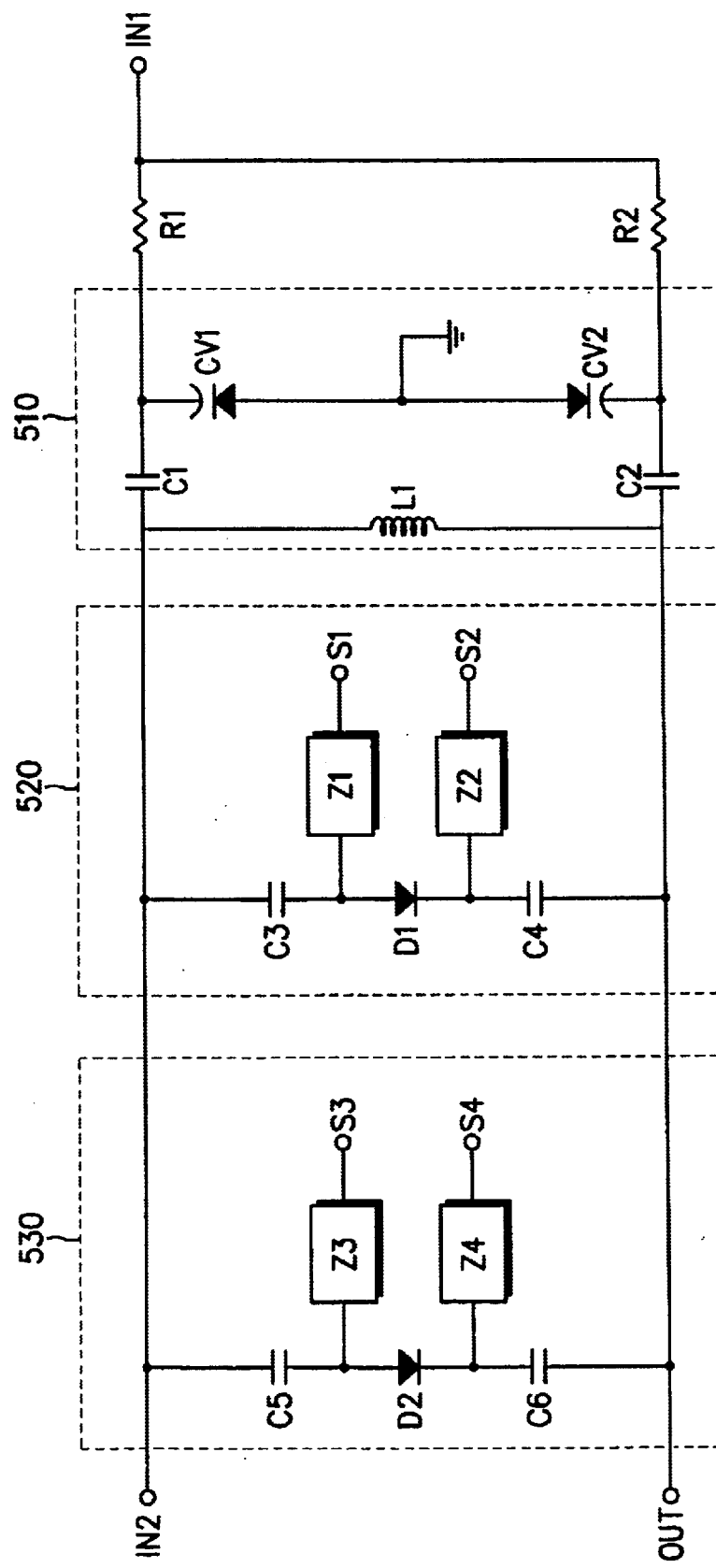
FIG. 3 is a circuit diagram illustrating the construction of a multi-band voltage controlled oscillator circuit in accordance with another embodiment of the present invention.

Although the preferred embodiment of the present invention has been disclosed for illustrative purpose, it will be understood that various modifications may be made without departing from the spirit and scope of the invention. FIG. 3 is a circuit diagram showing the construction of a multi-band VCO circuit in accordance with another embodiment of the present invention comprising two band selection circuits.

Referring to FIG. 3, the multi-band VCO circuit comprises a resonant circuit 510 for inputting a control voltage, and two band selection circuits 520 and 530 for generating a multi-band frequency signal in response to band selection signals that are applied thereto, respectively. The resonant circuit 510 has the same structure as that of the resonant circuit 310 in FIG. 2. Each of the band selection circuits 520 and 530 has the same structure as that of the band selection circuit 320 in FIG. 2 and are connected in parallel to the resonant circuit 510. A first band selection signal is applied to a terminal S1 or S2 of the band selection circuit 520, and a second band selection signal is applied to a terminal S3 or S4 of the band selection circuit 530. Accordingly, the VCO circuit of FIG. 3 determines its output signal frequency depending on the first and second band selection signals.

As described above, the present invention can be applied not only to a dual-band VCO but also a multi-band VCO. Therefore, this invention is not limited by the described embodiments, but only by the scope of the appended claims and equivalents thereof.

As apparent from the above description, the present invention provides a multi-band VCO circuit, which has the following advantages.

According to the present invention, the multi-band VCO circuit is capable of selecting a desired frequency band in response to a band selection signal, thereby improving a frequency band selectivity and enabling a stable and easy frequency adjustment. Besides, the use of capacitors and a pin diode increases the total Q value, resulting in an improvement in the quality of an oscillator. Moreover, the reduction of a design cost can be achieved by providing a frequency band selectable resonant circuit in the multi-band VCO circuit.

What is claimed is:

1. A multi-band voltage controlled oscillator circuit comprising:
    a resonant circuit operable in response to a control voltage, said resonant circuit having a resonance frequency determined depending on the control voltage; and
    at least one band selection circuit connected in parallel to said resonant circuit for adjusting the resonance frequency in response to a unique band selection signal, said band selection circuit having at least one switching element connected in series between at least two capacitors.

2. The multi-band voltage controlled oscillator circuit as set forth in claim 1, wherein said at least one band selection circuit comprises:
    first and second capacitors connected in series to each other and in parallel to said resonant circuit; and
    a switching element connected between said first and second capacitors for turning on/off said first and second capacitors in response to said band selection signal.

3. The multi-band voltage controlled oscillator circuit as set forth in claim 2, wherein said switching element is a pin diode.

4. The multi-band voltage controlled oscillator circuit as set forth in claim 3, wherein said pin diode has an anode connected to said first capacitor and a cathode connected to said second capacitor, said anode inputting a power supply voltage, said cathode inputting said band selection signal.

5. The multi-band voltage controlled oscillator circuit as set forth in claim 3, wherein said pin diode has an anode connected to said first capacitor and a cathode connected to said second capacitor, said anode inputting said band selection signal, said cathode being connected to ground.

6. The multi-band voltage controlled oscillator circuit as set forth in claim 3, further comprising an isolation element for isolating said band selection circuit from said band selection signal.

7. The multi-band voltage controlled oscillator circuit as set forth in claim 4, further comprising an isolation element for isolating said band selection circuit from said band selection signal.

8. The multi-band voltage controlled oscillator circuit as set forth in claim 5, further comprising an isolation element for isolating said band selection circuit from said band selection signal.

9. The multi-band voltage controlled oscillator circuit as set forth in claim 6, wherein said isolation element is one of a radio frequency choke coil and a resistor.

10. The multi-band voltage controlled oscillator circuit as set forth in claim 7, wherein said isolation element is one of a radio frequency choke coil and a resistor.

11. The multi-band voltage controlled oscillator circuit as set forth in claim 8, wherein said isolation element is one of a radio frequency choke coil and a resistor.

12. The multi-band voltage controlled oscillator circuit as set forth in claim 1, wherein said resonant circuit includes:
    first and second varactors connected to ground;
    third and fourth capacitors connected in series to said first and second varactors, respectively; and
    an inductor connected in parallel to said third and fourth capacitors.

13. The multi-band voltage controlled oscillator circuit as set forth in claim 12, wherein said first and second varactors are operated in response to control voltages, said control voltages being equal in level.

14. The multi-band voltage controlled oscillator circuit as set forth in claim 1, wherein the adjusted resonance frequency is used for generating a radio frequency signal of one of a CDMA band and a PCS band.

15. A multi-band voltage controlled oscillator circuit comprising:
- a resonant circuit including at least one varactor, at least one capacitor and at least one inductor operable in response to a control voltage, said resonant circuit having a resonance frequency determined according to capacitances of said at least one varactor and said at least one capacitor and an inductance of said at least one inductor; and
- at least one band selection circuit for adjusting said resonance frequency in response to a band selection signal, said at least one band selection circuit including at least one capacitor connected in parallel to said resonant circuit, and a switching element for turning on/off said at least one capacitor in response to said band selection signal.

16. The multi-band voltage controlled oscillator circuit as set forth in claim 15, wherein said switching element is a pin diode.

17. The multi-band voltage controlled oscillator circuit as set forth in claim 15, further comprising an isolation element for isolating said at least one band selection circuit from said band selection signal.

18. The multi-band voltage controlled oscillator circuit as set forth in claim 17, wherein said isolation element is one of a radio frequency choke coil and a resistor.

* * * * *